(12) United States Patent
Jeganathan et al.

(10) Patent No.: US 7,352,127 B2
(45) Date of Patent: *Apr. 1, 2008

(54) LED LAMP WITH LIGHT-EMITTING JUNCTION ARRANGED IN THREE-DIMENSIONAL ARRAY

(75) Inventors: Balu Jeganathan, Rowville (AU); John Albert Montagnat, East Ringwood (AU)

(73) Assignee: Lednium Pty Limited, Chatsworth (AU)

( * ) Notice: Subject to any disclaimer, the term of this patent is extended or adjusted under 35 U.S.C. 154(b) by 0 days.

This patent is subject to a terminal disclaimer.

(21) Appl. No.: 10/953,797

(22) Filed: Sep. 29, 2004

(65) Prior Publication Data

US 2005/0104515 A1 May 19, 2005

Related U.S. Application Data

(63) Continuation of application No. 10/049,572, filed as application No. PCT/AU01/00717 on Jun. 15, 2001, now Pat. No. 6,809,475.

(30) Foreign Application Priority Data

Jun. 15, 2000 (AU) .................. PQ8181/00

(51) Int. Cl.
*H01L 33/00* (2006.01)

(52) U.S. Cl. .................. 313/512; 313/499; 257/81; 362/800

(58) Field of Classification Search ........ 313/498–512; 257/79, 82, 88, 89, 81; 438/106–112, 121, 438/123; 362/216, 362, 364–366, 250, 252, 362/800
See application file for complete search history.

(56) References Cited

U.S. PATENT DOCUMENTS

| 3,581,162 A | 5/1971 | Wheatley |
| 3,763,405 A | 10/1973 | Mitsuhata |
| 3,875,456 A | 4/1975 | Kano et al. |
| 3,875,473 A | 4/1975 | Lebailly |
| 3,886,581 A | 5/1975 | Katsumura et al. |
| 3,886,681 A | 6/1975 | Katsumura et al. |
| 3,921,026 A | 11/1975 | Konishi et al. |
| 3,942,185 A | 3/1976 | Lebailly |
| 4,007,396 A | 2/1977 | Wisbey et al. |
| 4,054,814 A | 10/1977 | Fegley et al. |
| 4,173,035 A | 10/1979 | Hoyt |

(Continued)

FOREIGN PATENT DOCUMENTS

DE 34 38 154 A1 4/1986

(Continued)

OTHER PUBLICATIONS

Office Action dated Mar. 22, 2005 from co-pending U.S. Appl. No. 10/305,294, entitled Method of Producing a Lamp; filing date: Nov. 26, 2002.

(Continued)

*Primary Examiner*—Karabi Guharay
(74) *Attorney, Agent, or Firm*—Knobbe Martens Olson & Bear LLP

(57) ABSTRACT

In accordance with the present invention, there is provided a lamp including a plurality of semi-conductor light emitting junctions with a common layer of fluorescent material arranged thereover, wherein the junctions are provided in a three-dimensional array.

51 Claims, 6 Drawing Sheets

U.S. PATENT DOCUMENTS

| | | | |
|---|---|---|---|
| 4,255,688 A | 3/1981 | Nagasawa | |
| 4,271,408 A | 6/1981 | Teshima et al. | |
| 4,467,193 A | 8/1984 | Carroll | |
| 4,473,834 A | 9/1984 | Soclof | |
| 4,703,219 A | 10/1987 | Mesquida | |
| 4,851,824 A | 7/1989 | Murata | |
| 4,878,107 A | 10/1989 | Hopper | |
| 4,893,223 A * | 1/1990 | Arnold | 362/252 |
| 4,935,665 A | 6/1990 | Murata | |
| 4,975,814 A | 12/1990 | Scjaorer | |
| 5,055,892 A | 10/1991 | Gardner et al. | |
| 5,084,804 A | 1/1992 | Schairer | |
| 5,119,174 A | 6/1992 | Chen | |
| 5,218,233 A | 6/1993 | Takahashi | |
| 5,289,082 A | 2/1994 | Komoto | |
| 5,373,280 A | 12/1994 | Louy et al. | |
| 5,404,282 A | 4/1995 | Klinke et al. | |
| 5,455,199 A | 10/1995 | Sakamoto | |
| 5,515,253 A | 5/1996 | Sjobom | |
| 5,519,596 A | 5/1996 | Woolverton | |
| 5,534,718 A | 7/1996 | Chang | |
| 5,561,346 A * | 10/1996 | Byrne | 313/512 |
| 5,594,424 A | 1/1997 | Louy et al. | |
| 5,709,453 A | 1/1998 | Krent et al. | |
| 5,959,316 A | 9/1999 | Lowery | |
| 5,962,971 A | 10/1999 | Chen | |
| 5,998,925 A | 12/1999 | Shimizu | |
| 5,999,151 A | 12/1999 | Michael | |
| 6,068,383 A | 5/2000 | Robertson et al. | |
| 6,331,063 B1 | 12/2001 | Kamada et al. | |
| 6,367,949 B1 | 4/2002 | Pederson | |
| 6,409,938 B1 | 6/2002 | Comanzo | |
| 6,412,971 B1 * | 7/2002 | Wojnarowski et al. | 362/249 |
| 6,521,916 B2 | 2/2003 | Roberts | |
| 6,599,000 B2 | 7/2003 | Nolan et al. | |
| 6,809,475 B2 * | 10/2004 | Jeganathan et al. | 313/512 |
| 6,961,190 B1 | 11/2005 | Tamaoki et al. | |
| 2002/0006040 A1 | 1/2002 | Kamada et al. | |
| 2002/0042156 A1 | 4/2002 | Chen | |
| 2002/0101157 A1 | 8/2002 | Suehiro | |
| 2002/0113244 A1 | 8/2002 | Barnett et al. | |
| 2003/0107316 A1 | 6/2003 | Murakami et al. | |
| 2003/0151343 A1 | 8/2003 | Jeganathan et al. | |
| 2005/0285505 A1 | 12/2005 | Jeganathan et al. | |

FOREIGN PATENT DOCUMENTS

| | | |
|---|---|---|
| DE | 2361531 | 12/1987 |
| DE | 4107526 | 10/1991 |
| DE | 4124413 | 1/1993 |
| DE | G 93 16 106.9 | 10/1993 |
| DE | G 93 16 106.9 | 3/1994 |
| DE | 20007730 U1 | 9/2000 |
| DE | 199 22 176 A1 | 11/2000 |
| DE | 200 13 605 U1 | 12/2000 |
| DE | 20110289 | 6/2001 |
| DE | 100 25 563 | 12/2001 |
| EP | 0107480 | 5/1984 |
| EP | 0 303 741 | 2/1989 |
| EP | 0 354 468 | 2/1990 |
| EP | 0 364 806 | 1/1993 |
| EP | 0921568 | 11/1998 |
| EP | 1098373 | 5/2001 |
| EP | 1 213 773 A1 | 6/2002 |
| FR | 2.198.675 | 3/1974 |
| FR | 2.290.721 | 6/1976 |
| FR | 2518317 | 6/1983 |
| FR | 2588109 | 4/1987 |
| FR | 2 707 222 A1 | 1/1995 |
| FR | 2779508 | 12/1999 |
| GB | 2311126 | 9/1997 |
| GB | 2348324 | 9/2000 |
| GB | 2356037 | 5/2001 |
| GB | 2361581 A | 10/2001 |
| JP | 57156442 A2 | 9/1982 |
| JP | 61032483 | 2/1986 |
| JP | 61-141165 | 6/1986 |
| JP | 11261114 | 11/1991 |
| JP | 06-222722 | 8/1994 |
| JP | 08162672 | 6/1996 |
| JP | 11163411 | 11/1997 |
| JP | 10200168 | 7/1998 |
| JP | 10-242523 | 9/1998 |
| JP | 10269822 | 10/1998 |
| JP | 11-26816 | 1/1999 |
| JP | 11162231 | 6/1999 |
| JP | 11162232 | 6/1999 |
| JP | 11163412 | 6/1999 |
| JP | 11-177144 | 7/1999 |
| JP | 2000-252524 | 9/2000 |
| JP | 2002-245812 | 8/2002 |
| JP | 2002-336275 | 11/2002 |
| JP | 2003-31005 | 1/2003 |
| TW | 408497 | 10/2000 |
| WO | WO 97/12386 A2 | 4/1997 |
| WO | WO 00/02261 | 1/2000 |
| WO | WO 00/57490 | 6/2000 |
| WO | WO 01/08228 A1 | 2/2001 |
| WO | WO 01/33640 | 5/2001 |
| WO | WO 01/50540 | 7/2001 |
| WO | WO 01/97287 A1 | 12/2001 |
| WO | WO 02/091489 | 11/2002 |
| WO | WO 02/103794 | 12/2002 |
| WO | WO 03/056636 | 7/2003 |
| WO | WO 03/107423 | 12/2003 |

OTHER PUBLICATIONS

PCT International Search Report, App. No. PCT/AU03/00724, Date: Jun. 11, 2003.
PCT International Search Report, App. No. PCT/AU2004/000283, Date Mar. 5, 2004.
Suppl. European Search Report, EP 01942891, Date: Aug. 2, 2006.
Suppl. European Search Report, EP 03727013, Date: Sep. 13, 2006.
OA Oct. 5, 2006 from co-pending U.S. Appl. No. 10/305,294 Method of Producing a Lamp, filing date Nov. 26, 2002.
OA Mar. 26, 2007 from co-pending U.S. Appl. No. 10/305,294 Method of Producing a Lamp, filing date Nov. 26, 2002.
Supplemental European Search Report, EP 02 72 9655, Date: Feb. 7, 2007.
U.S. Appl. No. 10/049,572, filed Oct. 10, 2002, Jeganathan, et al.
U.S. Appl. No. 10/305,294, filed Aug. 14, 2003, Jeganathan, et al.
U.S. Appl. No. 10/487,040, filed Dec. 29, 2005, Jeganathan et al.
U.S. Appl. No. 10/548,498, filed Apr. 19, 2007, Jeganathan et al.
Jun. 24, 2003 Office Action fr U.S. Appl. No. 10/049,572 LED Lamp, filed Feb. 14, 2002.
Dec. 11, 2003 Office Action fr U.S. Appl. No. 10/049,572 LED Lamp, filed Feb. 14, 2002.
Jun. 8, 2004 Notice of Allowance fr U.S. Appl. No. 10/049,572 LED Lamp, filed Feb. 14, 2002.
Sep. 22, 2004 Office Action fr U.S. Appl. No. 10/305,294 Method of Producing a Lamp, filed Nov. 26, 2002.
Sep. 22, 2005 Office Action fr U.S. Appl. No. 10/305,294 Method of Producing a Lamp, filed Nov. 26, 2002.
Mar. 13, 2006 Office Action fr U.S. Appl. No. 10/305,294 Method of Producing a Lamp, filed Nov. 26, 2002.
Oct. 18, 2007 Notice of Allowance fr U.S. Appl. No. 10/305,294 Method of Producing a Lamp, filed Nov. 26, 2002.

* cited by examiner

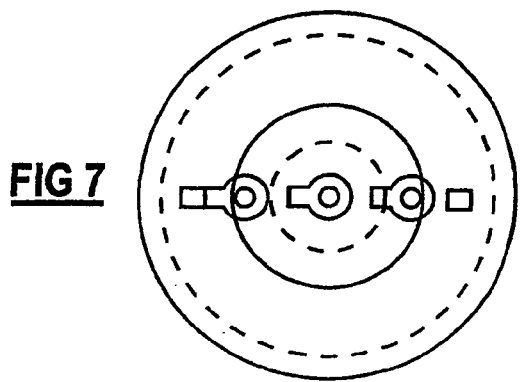
FIG 7
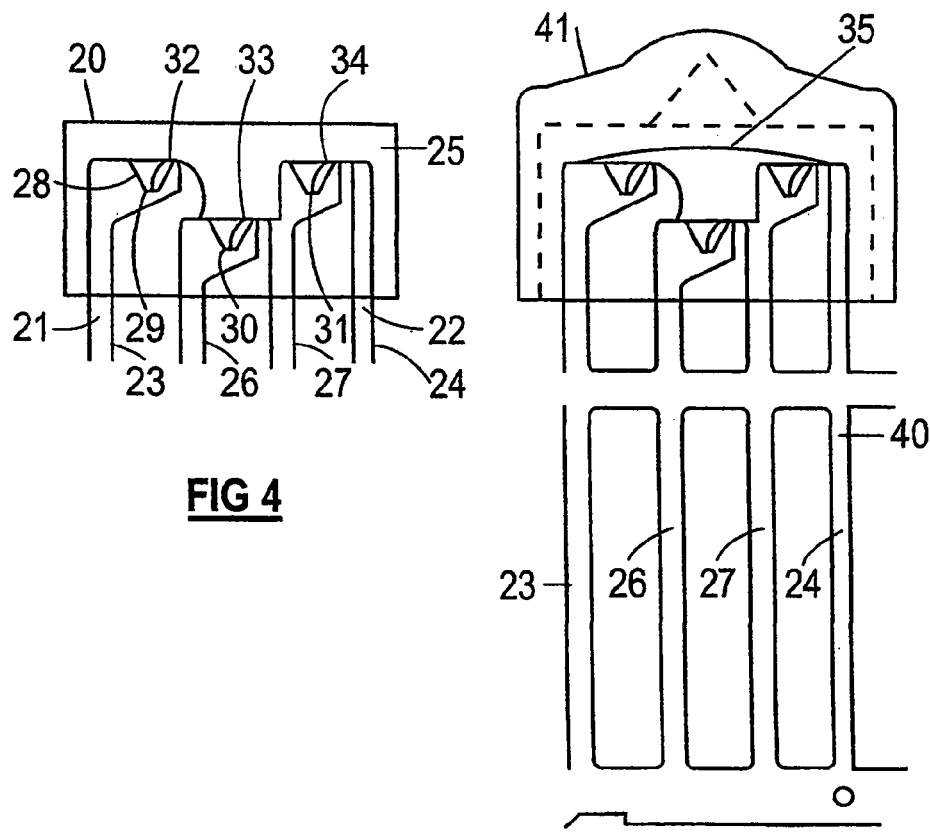
FIG 4
FIG 6
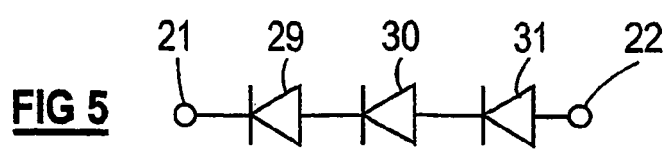
FIG 5

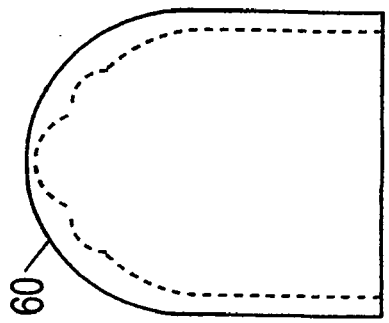
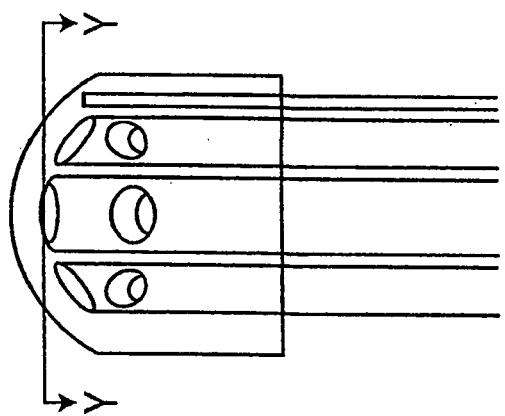
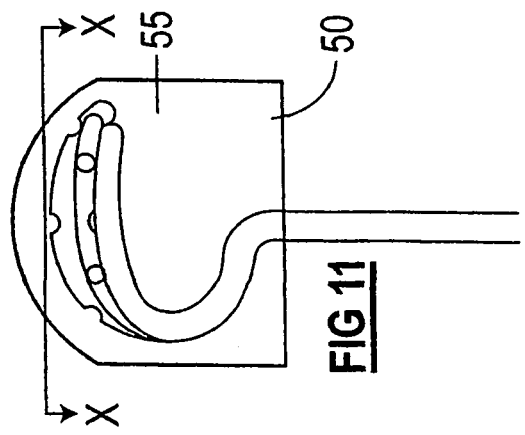
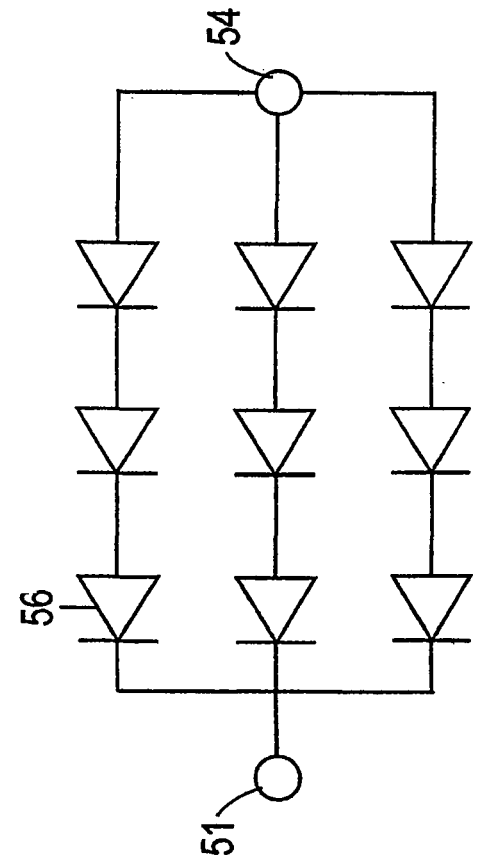
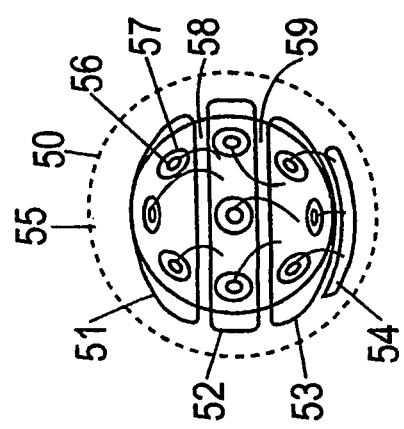

LED LAMP WITH LIGHT-EMITTING JUNCTION ARRANGED IN THREE-DIMENSIONAL ARRAY

RELATED APPLICATION

This application is a continuation of U.S. patent application Ser. No. 10/049,572, filed on Feb. 14, 2002 now U.S. Pat. No. 6,809,475, which is the entry into the National Phase, Under 35 U.S.C. § 371, of International Patent Application PCT/AU01/00717 filed on Jun. 15, 2001, and published in English as WO 0197287, which claims priority to Australian Patent Application PQ8181/00, filed on Jun. 15, 2000, the entire disclosures of which are hereby incorporated by reference herein

FIELD OF THE INVENTION

The present invention relates to an LED lamp.

BACKGROUND OF THE INVENTION

U.S. Pat. No. 5,998,925 discloses a light emitting device which comprises a semi-conductor light emitting layer embedded in a transparent globe. A fluorescent material covers the semi-conductor layer to receive the emitted light for transmission at a different wavelength, i.e. in a predetermined colour.

To increase the intensity of the light output, additional semi-conductor devices may be added, such as shown in U.S. Pat. No. 5,289,082, which discloses an LED lamp having a plurality of semi-conductive chips mounted in a translucent body. Each chip emits a discrete light pattern, however, and that may be undesirable if the light from the lamp is desired to have an appearance of emitting from a single, point-like light source. In U.S. Pat. No. 5,289,082, the discrete light outputs are combined and focussed, by specific shaping of the body to produce an overall light output having a required illumination pattern.

GB 2311126 discloses a comparatively large scale light source which includes an array of separately mounted light emitting diodes which appear to have respective leads hardwired to a planar conductor. The diodes are encapsulated by a lens which is used to focus the light from the array.

OBJECT OF THE INVENTION

The present invention seeks to provide an alternative form of LED lamp which can provide high intensity output by utilising a plurality of light emitting diodes, whilst maintaining the appearance of a substantially point source of illumination.

SUMMARY OF THE INVENTION

In accordance with the present invention, there is provided a lamp including a plurality of semi-conductor light emitting junctions with a common layer of fluorescent material arranged thereover, wherein the junctions are provided in a three-dimensional array.

In another aspect, there is provided a lamp including a plurality of semi-conductor light emitting junctions with a common layer of fluorescent material arranged thereover, wherein the junctions are mounted to a curved support structure so as to be arranged substantially on an imaginary spheroid surface.

The common layer of fluorescent material can serve to receive light from adjacent junctions and transmit same in a distributed fashion, so that the resultant light appears, to the naked eye, to be emanating from a single point source of illumination. Further, the layer can be applied over the junctions in a single step, and that in turn can lead to substantial simplification in the procedure for constructing the lamp, as compared to formation of the discrete chips of U.S. Pat. No. 5,289,082, which would need to be individually constructed or produced using additional steps of masking and etching.

Preferably, the lamp includes a globe portion and the junctions are embedded within the globe portion so that the lamp is formed as a unitary structure.

Preferably, the junctions are mounted to, and electrically coupled with, at least one curved conductor.

In another broad aspect, the invention provides a lamp including a plurality of light emitting junctions mounted to at least one curved conductor so as to adopt a three-dimensional array, wherein the lamp includes a common layer of fluorescent material over at least adjacent junctions.

In yet another aspect, there is provided a lamp including a plurality of light emitting junctions mounted to at least one (curved conductor so as to adopt a three-dimensional array, wherein the at least one curved conductor includes a recess for receipt of a respective one of the junctions.

Preferably, the at least one curved conductor is configured such that junctions are arranged substantially on an imaginary spheroid surface.

The curved configuration of the conductors and, in particular, the junctions being arranged on a substantially spheroid imaginary surface provides an advantage that the overall light generated by the lamp will appear to be coming from a generally singular small spherical or point source.

Preferably, the recess has side walls which function as an optical guide for controlling the direction of light transmission and/or the angle of divergence.

Preferably, the lamp includes a globe portion, with the junctions and the at least one curved conductor being embedded within the globe portion so that the lamp is formed as a unitary structure.

Preferably, the lamp includes a lens adapted to fit with the globe portion, and configured to shape the light emitted from the globe portion into a predetermined pattern.

BRIEF DESCRIPTION OF THE DRAWINGS

The invention will be described in more detail with reference to the drawings in which:

FIG. 4 is a diagrammatic cross-sectional view of a second LED lamp;
FIG. 5 is a circuit diagram of the lamp of FIG. 4;
FIG. 6 is a cross-sectional view of the lamp of FIG. 4;
FIG. 7 is a plan view of the lamp of FIG. 4,
FIG. 9 is a plan view of a third lamp;
FIG. 10 is a circuit diagram for the lamp of FIG. 9;
FIG. 11 is a front view of the lamp of FIG. 9;
FIG. 12 is a side view of the lamp of FIG. 9;
FIG. 13 is a side view of a lens for fitting on the lamp of FIG. 9.

DETAILED DESCRIPTION OF THE PREFERRED EMBODIMENT

Figure 1:
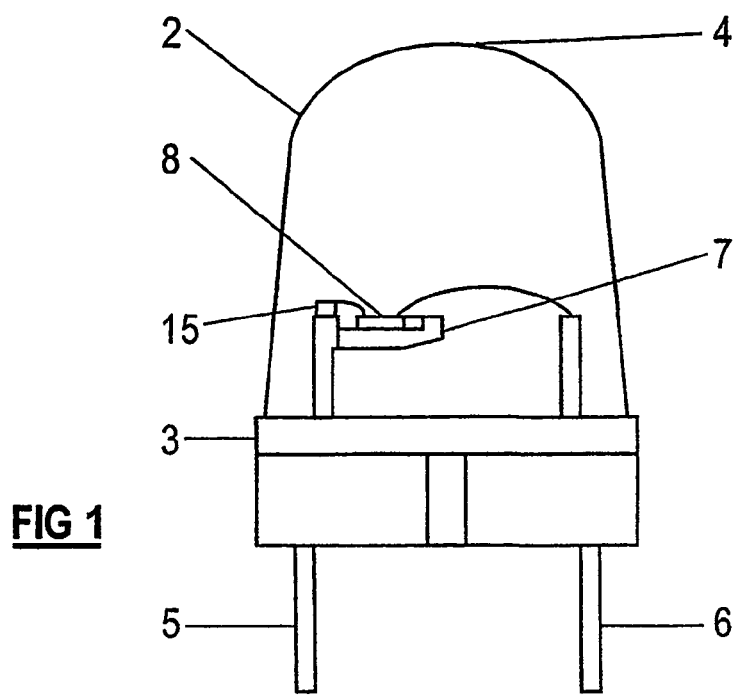
FIG. 1 is a side-view of an LED lamp.
Figure 3:
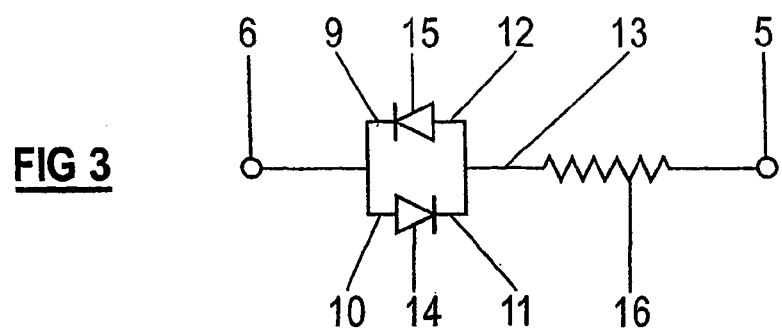
FIG. 3 is a circuit diagram for the lamp of FIGS. 1 and 2.

The lamp, as shown in FIG. 1, includes a globe portion 2 with a cylindrical base 3 and a parabolic end 4, configured to enhance illumination output in an axial direction of the lamp. The lamp also includes first and second terminals, which are preferably in the form of conductors 5,6 which are embedded within the globe portion 2. The lead 5 has a support platform 7 to which is mounted an integrated circuit wafer 8. In the example given, the wafer includes two junctions which are arranged substantially adjacent each other so that a common layer of fluorescent material, such as a phosphor layer, may be applied over both junctions. Intermediate conductors 9 to 12 electrically couple the junctions to the respective terminal 5,6 so that the LED junctions 14,15 are arranged in reverse polarity, as indicated in the circuit diagram FIG. 3. A resistive element 16 is provided between a further conductor 13 (connecting the intermediate conductors 11 and 12) and the lead 5.

The conductors 5,6, intermediate conductors 9 to 13, and wafer 8 are all embedded within the globe portion 2 so that the lamp is presented as a robust unitary structure. The reverse polarity of the junctions allows the lamp to be connected to a power source without concern for polarity, as compared to the case with a conventional LED arrangement. The use of a single phosphor layer, common to each of the junctions, also simplifies manufacture and provides an aesthetic advantage in that the light from either junction is perceived to originate from a single source.

In a preferred form of the LED lamp, the following specifications may apply:

| | |
|---|---|
| NOMINAL SIZE | 9.5 mm diameter |
| LIGHT COLOUR | WHITE |
| GLOBE COLOUR | WATER CLEAR |
| LIGHT INTENSITY | SUPERBRIGHT TYPICAL LIGHT OUTPUT >500 mCd @ 20 mA |
| GUARANTEED LIFE | 30,000 HOURS |
| FOCUS | HALF ANGLE 15° typ. |
| BASE STYLE | INTERCHANGEABLE WITH WEDGE TYPE LAMPS |
| LEAD DIMENSIONS | 6 mm nom. OUTSIDE BASE WEDGE |
| SUPPLY VOLTAGE | 12 VOLTS nom. {>11.5 < 14 volts AC or DC} |
| FORWARD CURRENT | 20 +8/−3 mA @ 12 Volts |
| FORWARD VOLTAGE | 3.6 min (typ) 4.0 max. @ 20 mA |
| REVERSE VOLTAGE | 5 Volts min. |
| POWER DISSIPATION | LED JUNCTIONS 120 Mw RESISTOR 170 mW |
| REVERSE CURRENT | $50 \times 10^{-3}$ mA max. @ 5 V |
| INTERNAL RESISTOR | 430 ohms nom. |

It should, however, be appreciated that the size configuration and operating parameters of any of the component parts of tie lamp may vary, as required and the number of LED junctions may also be increased ton suit illumination needs.

Figure 2:
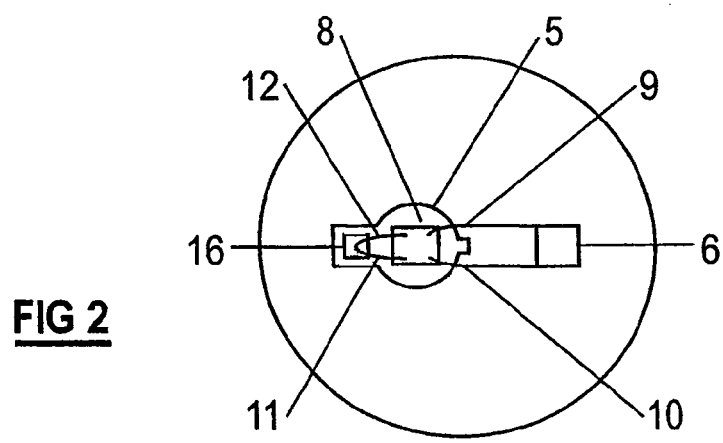
FIG. 2 is a plan-view of the lamp of FIG. 1.

A second lamp 20 is now described with reference to FIGS. 4 to 8. The lamp 20 is generally similar in construction to that of FIGS. 1 to 3, in sofar as first and second terminals 21 and 22 are provided, in the form of conductors 23,24 embedded in a globe portion 25, together with additional conductors 26,27. Each of the conductors 23,26 and 27 have a respective recess 28, to profile support structure for receiving an associated junction, indicated by reference numerals 29,30,31. The junctions are covered by a common layer of phosphor 35 and are electrically coupled between each respective conductors 23,26,27 to which they are mounted, and the adjacent conductor via intermediate conductors 32,33,34. In the example shown, the junctions are serially connected, as represented by the circuit diagram of FIG. 5.

All of the conductors 23, 24,26,27 are preferably formed in a two dimensional lead frame structure 40 shown in FIG. 6, to allow ease of manufacture and reliability in directly positioning the junctions 29,30,31 within the globe portion 25, after application of the phosphor layer 35. As can be seen from both FIGS. 6 and 7, the junctions 29,30,31 are arranged in a generally linear array, with the conductors 23,27 projecting above the conductor 26 so that the overall illumination generated by the junctions will be somewhat enhanced on-axis, as represented in FIG. 8 by curve A.

Figure 8:
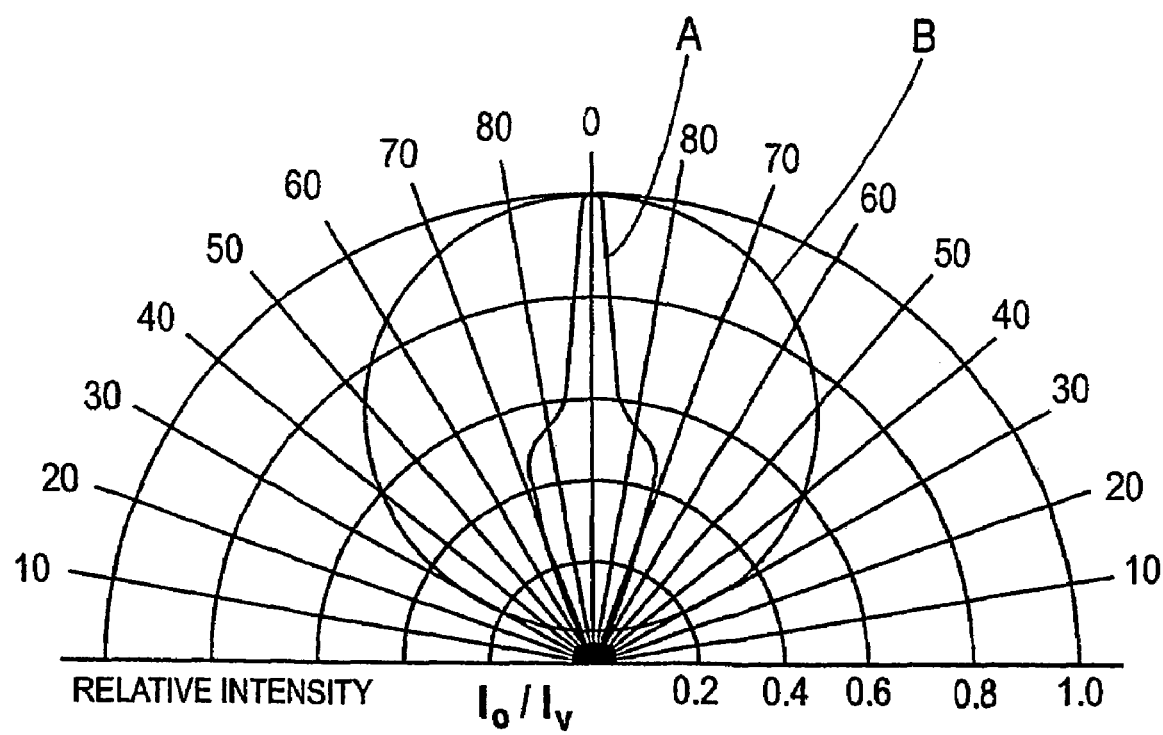
FIG. 8 is a representation of an illumination pattern of the lamp of FIGS. 4 to 7.

The lamp 20 may also be provided with a lens 41 which is fitted to the globe portion 25 and shaped so as to modify the light generated by the lamp to produce, for example, the illumination pattern represented by curve B in FIG. 8, whereby the output illumination is somewhat more evenly distributed.

Turning now to FIGS. 9 to 16, a third lamp 50 is illustrated. Again, the lamp 50 is in general similar to the previous lamp construction in sofar as a plurality of conductors 51,52,53 and 54 are embedded within a unitary globe portion 55 and have light emitting junctions 56 mounted in respective recesses 57 and covered by a common layer of fluorescent material 59. Each junction is again electrically coupled to the respective conductor to which it is mounted and an adjacent conductor via intermediate conductors 58 so as to form the circuit illustrated in FIG. 10. Each of the conductors 51 to 54, in this instance, however, carrying three junctions 56.

The conductors 51 to 54 are curved within the globe portion 55 so as to support the junctions on an imaginary curved surface such as a spheroid and, in that manner, the illumination generated by the lamp 50 will have an appearance of emanating from a small, generally spheroid point like source. A lens 60 may also be provided for modifying the output of the junctions to produce a more even distribution pattern such as represented by curve C in FIG. 16, which is the illumination output observed from a plan view of the lamp 50, i.e. when the lamp is seen from the same direction as viewed in FIG. 9.

In addition to modifying the light output by using the lens 60, it is also possible to arrange the conductors in any desired configuration and the construction of the recesses 57 may also be used to assist in controlling the directional output of the light emitted from the various junctions. In particular, the configuration of each recess may be such that for example, the recess side walls act as optical guides to control the direction and/or angle of divergence of light emitted from each junction.

Figure 14:
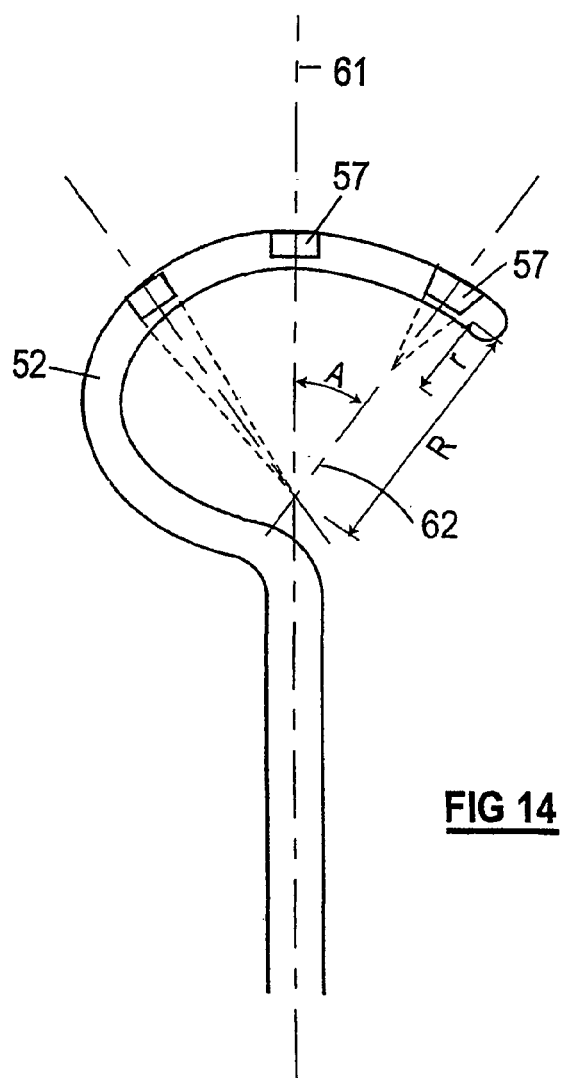
FIG. 14 is a cross-sectional view taken along the line X-X shown in FIG. 9.
Figure 15:
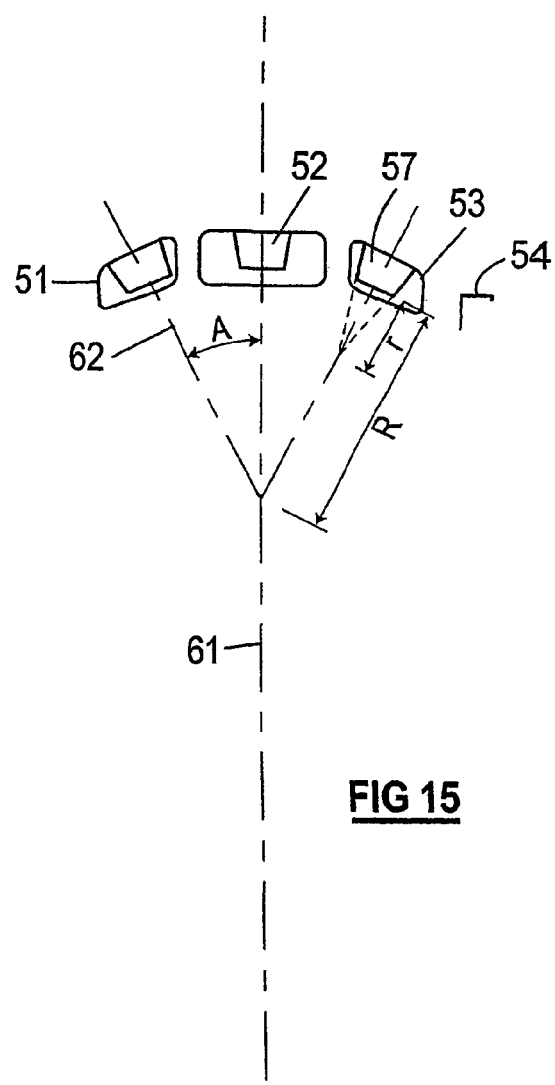
FIG. 15 is a cross-sectional view taken along the line Y-Y shown in FIG. 10; and, FIG. 16 is a representation of the illumination pattern produced by the lamp of FIGS. 9 to 12.
Figure 16:
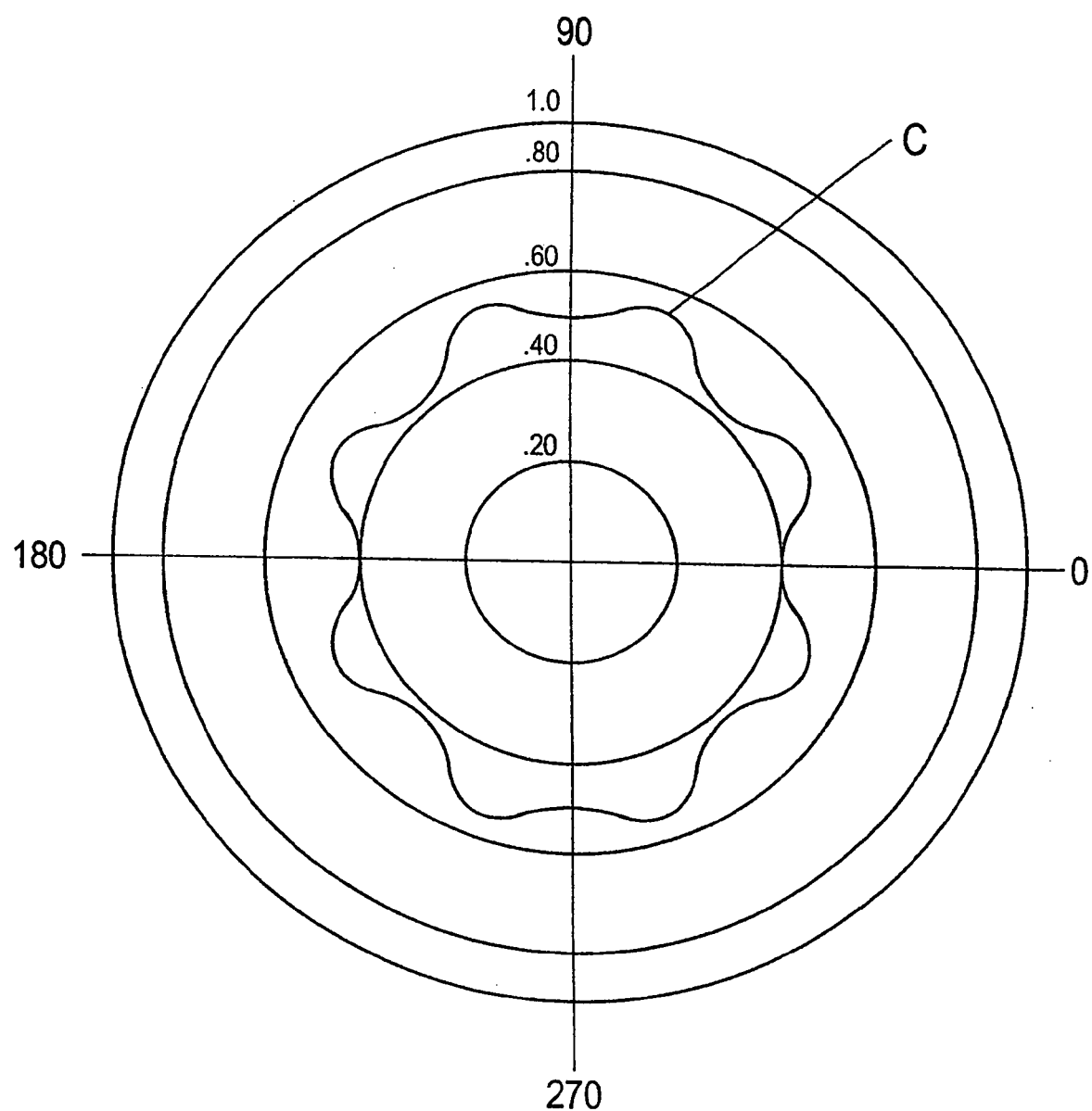

More specifically, the shape of each recess and its effect on the light output from the junctions will now be described in more detail with reference to FIGS. 14 and 15, which show cross-sectional views of the relevant conductors taken along the lines X-X and Y-Y shown in FIGS. 11 and 12 respectively.

The recesses 57 containing the LED junctions are positioned and shaped in the conductors 51,52,53 so that the beams of light emerging from the recesses may be combined in free space outside the lamp 50 in predictable patterns determined by the radius of the imaginary part spherical surface designated 'R', the distance from the LED junction in the recess to the intersection of the imaginary extension of the sides of a recess-designated 'r' and the angle 'A' between the centre line 61 of the lamp 50 and a centre line 62 passing through the perpendicular to any other LED junction.

The radius 'R' of the imaginary spherical surface is the distance from the intersection of those centre lines to the LED junction within the recess. The angle between the sides of a recess determines the value of the 'r'.

In the limiting case where 'r' is equal to or greater than 'R', the light from each LED junction will be shaped by the recesses into beams which do not cross, regardless of the value of angle 'A'. For all values of 'r' less than 'R' it will be possible to have the light beam from each LED junction coincide with the edges of the light beams from adjacent LED junctions. The exact positioning if this instance will be determined by the ratio R/r and the value of angle 'A'.

As may be appreciated from the above, the present invention allows considerable scope for obtaining a light source using junction diodes, with a predetermined one of a variety of output illumination patterns whilst maintaining a generally simple construction. A particular advantage is that the various junctions are of small size and may be configured to produce a light output which may be perceived by the naked eye to be emanating from a single point source of light.

The above LED lamps have been described by way of non-limiting example only, and many modifications and variations may be made thereto without departing from the spirit and scope of the invention as hereinbefore described.

What is claimed is:

1. A lamp comprising a plurality of recesses arranged in a plurality of curved conductors to form a three-dimensional array of recesses and light emitting junctions mounted in the recesses, wherein the plurality of curved conductors is configured such that junctions are arranged substantially on an imaginary spheroid surface.

2. A lamp as claimed in claim 1, wherein the lamp includes a globe portion, with the junctions and the plurality of curved conductors being embedded within the globe portion so that the lamp is formed as a unitary structure.

3. A lamp as claimed in claim 2, wherein the lamp includes a lens adapted to fit with the globe portion, and configured to shape the light emitted from the globe portion into a predetermined pattern.

4. A lamp as claimed in claim 1, wherein the lamp comprises at least three curved conductors.

5. A lamp as claimed in claim 1, wherein each of the junctions is electrically connected to a respective one of the plurality of curved conductors to which it is mounted and to an adjacent curved conductor.

6. A lamp as claimed in claim 5, wherein the groups of junctions electrically connected in series are positioned beneath a lens.

7. A lamp as claimed in claim 1, wherein the plurality of curved conductors receives each of the respective junctions in a separate recess.

8. A lamp as claimed in claim 7, wherein the plurality of curved conductors are embedded within a globe portion of a lamp.

9. A lamp as claimed in claim 8, wherein each of the junctions is electrically connected to the one of the plurality of curved conductors to which it is mounted and to an adjacent curved conductor.

10. A lamp as claimed in claim 9, wherein the groups of junctions electrically connected in series are positioned beneath a lens.

11. A lamp as claimed in claim 7, wherein the lamp comprises at least three curved conductors.

12. A lamp as claimed in claim 7, wherein junctions received in respective recesses are electrically connected to respective ones of the plurality of curved conductors and to an adjacent conductor.

13. A lamp as claimed in claim 7, wherein the recess has side walls which function as an optical guide for controlling a direction of light transmission and/or an angle of divergence.

14. A lamp as claimed in claim 1, wherein the at least one curved conductor is configured such that junctions are arranged on an imaginary spheroid surface.

15. A lamp as claimed in claim 1, wherein the junctions have a common layer of fluorescent material arranged thereover.

16. A lamp as claimed in claim 1, wherein the lamp comprises a common layer of fluorescent material over at least adjacent junctions.

17. A lamp as claimed in claim 1, wherein the plurality of curved conductors is substantially convex.

18. A lamp as claimed in claim 1, wherein the plurality of curved conductors is substantially part-spherical.

19. The lamp of claim 1, wherein each conductor of the plurality of curved conductors comprises a plurality of recesses with junctions mounted therein, such that the junctions mounted in respective recesses of each conductor form corresponding groups of light emitting junctions electrically interconnected in parallel, the groups being electrically interconnected in series.

20. A lamp comprising a plurality of light emitting junctions mounted in recesses of a plurality of curved conductors to form a three-dimensional array of recesses, wherein the plurality of curved conductors receives each of the respective junctions in a separate recess, wherein the plurality of curved conductors is configured such that junctions are arranged substantially on an imaginary spheroid surface.

21. A lamp as claimed in claim 20, wherein the curved conductors are configured such that the junctions are arranged on an imaginary spheroid surface.

22. A lamp as claimed in claim 20, wherein the recesses have side walls which function as an optical guide for controlling at least one of: a direction of light transmission and an angle of divergence.

23. A lamp as claimed in claim 20, wherein the lamp includes a globe portion, with the junctions and the plurality of curved conductors being embedded within the globe portion so that the lamp is formed as a unitary structure.

24. A lamp as claimed in claim 23, wherein the lamp includes a lens adapted to fit with the globe portion, and configured to shape the light emitted from the globe portion into a predetermined pattern.

25. A lamp as claimed in claim 20, wherein the respective ones of the plurality of curved conductors comprise curved conducting surfaces and the recesses are formed therein.

26. A lamp as claimed in claim 25, wherein the shapes of the plurality of curved conductors allow light generated by the lamp to appear to be coming from a generally singular small spherical or point source.

27. A lamp as claimed in claim 20, wherein junctions received in respective recesses are electrically connected to respective ones of the plurality of curved conductors and to an adjacent conductor.

28. A lamp as claimed in claim 20, wherein the junctions have a common layer of fluorescent material arranged thereover.

29. A lamp as claimed in claim 20, wherein the lamp comprises a common layer of fluorescent material over at least adjacent junctions.

30. A lamp as claimed in claim 20, wherein the plurality of curved conductors is substantially convex.

31. A lamp as claimed in claim 20, wherein the plurality of curved conductors is substantially part-spherical.

32. The lamp of claim 20, wherein each conductor of the plurality of curved conductors comprises a plurality of recesses with junctions mounted therein, such that the junctions mounted in respective recesses of each conductor form corresponding groups of light emitting junctions electrically interconnected in parallel, the groups being electrically interconnected in series.

33. A lamp including a plurality of recesses arranged to form a three-dimensional array of recesses in a plurality of curved conductors, wherein light emitting junctions are mounted in the recesses, wherein the junctions are arranged so as to be substantially on an imaginary spheroid surface, and wherein the lamp includes a globe portion, with the junctions and the recesses being embedded within the globe portion so that the lamp is formed as a unitary structure.

34. A lamp as claimed in claim 33, wherein the lamp includes a lens adapted to fit with the globe portion, and configured to shape the light emitted from the globe portion into a predetermined pattern.

35. A lamp as claimed in claim 33, wherein the plurality of curved conductors are embedded within a globe portion of a lamp.

36. A lamp as claimed in claim 33, wherein the lamp comprises at least three curved conductors.

37. A lamp as claimed in claim 33, wherein at least two recesses are formed in each of the plurality of curved conductors.

38. A lamp as claimed in claim 33, wherein each junction mounted in a recess is electrically connected to the recess and to an adjacent conductor configured to provide light regardless of the polarity of an electrical power source connected to the lamp.

39. A lamp as claimed in claim 33, wherein each of the junctions is electrically connected to a respective one of the plurality of curved conductors to which it is mounted and to an adjacent curved conductor.

40. A lamp as claimed in claim 39, wherein the junctions are grouped so as to form groups of junctions electrically connected in series.

41. A lamp as claimed in claim 33, wherein the arrangement of recesses and junctions is such that light produced by the lamp appears to emanate from a substantially point source.

42. A lamp as claimed in claim 33, wherein the junctions are arrange so as to be on an imaginary spheroid surface.

43. A lamp as claimed in claim 33, wherein the recesses have side walls forming an optical guide for controlling at least one of a direction of light emission from the lamp and an angle of divergence of light emission from the lamp.

44. A lamp as claimed in claim 33, wherein the plurality of curved conductors is substantially convex.

45. A lamp as claimed in claim 33, wherein the plurality of curved conductors is substantially part-spherical.

46. A lamp including a plurality of recesses arranged to form a three-dimensional array of recesses, wherein the plurality of recesses are formed in a plurality of curved conductors, which is substantially part-spherical, wherein light emitting junctions are mounted in the recesses, and wherein the junctions have a common layer of fluorescent material arranged thereover.

47. A lamp as claimed in claim 46, wherein the plurality of curved conductors is substantially convex.

48. A lamp as claimed in claim 46, wherein at least one of the plurality of curved conductors is part-spherical.

49. A lamp including a plurality of recesses arranged to form a three-dimensional array of recesses, wherein the plurality of recesses are formed in a plurality of curved conductors, which is substantially part-spherical, wherein light emitting junctions are mounted in the recesses, and wherein the lamp comprises a common layer of fluorescent material over at least adjacent junctions.

50. A lamp as claimed in claim 49, wherein the plurality of curved conductors is substantially convex.

51. A lamp as claimed in claim 49, wherein at least one of the plurality of curved conductor is part-spherical.

* * * * *